United States Patent [19]

Gegenwart et al.

[11] Patent Number: 5,237,152
[45] Date of Patent: Aug. 17, 1993

[54] APPARATUS FOR THIN-COATING PROCESSES FOR TREATING SUBSTRATES OF GREAT SURFACE AREA

[75] Inventors: Rainer Gegenwart, Roedermark; Roland Gesche, Seligenstadt; Karl-Heinz Kretschmer, Langen; Jochen Ritter, Laubach, all of Fed. Rep. of Germany; Sonja Noll, Tsukuba, Japan

[73] Assignee: Leybold Aktiengesellschaft, Hanau, Fed. Rep. of Germany

[21] Appl. No.: 768,014

[22] Filed: Sep. 30, 1991

[30] Foreign Application Priority Data

Aug. 8, 1991 [DE] Fed. Rep. of Germany ....... 4126216

[51] Int. Cl.$^5$ .............................................. B23K 9/00
[52] U.S. Cl. ........................ 219/121.47; 219/121.43; 219/10.55 A; 219/121.44; 156/345; 427/446; 204/298.18
[58] Field of Search ........ 219/121.43, 121.4, 10.55 A, 219/10.55 R, 121.47; 156/345; 204/298.37, 298.18; 427/34

[56] References Cited

U.S. PATENT DOCUMENTS

| | | | |
|---|---|---|---|
| 4,006,340 | 2/1977 | Gorinas | 219/121.43 |
| 4,433,228 | 2/1984 | Nishimatsu et al. | 219/10.55 R |
| 4,438,368 | 3/1984 | Abe et al. | 219/121.43 |
| 4,908,492 | 3/1990 | Okamoto et al. | 219/121.52 |
| 4,924,061 | 5/1990 | Labat et al. | 219/121.52 |
| 4,939,424 | 7/1990 | Kieser et al. | |
| 4,987,284 | 1/1991 | Fujimura et al. | 219/10.55 R |
| 5,047,612 | 9/1991 | Savkar et al. | 219/121.47 |

FOREIGN PATENT DOCUMENTS

| | | |
|---|---|---|
| 0279895 | 8/1988 | European Pat. Off. . |
| 0383567 | 8/1990 | European Pat. Off. . |
| 0398832 | 11/1990 | European Pat. Off. . |
| 3705666 | 9/1988 | Fed. Rep. of Germany . |
| 3844034 | 2/1990 | Fed. Rep. of Germany . |
| 4034450 | 6/1991 | Fed. Rep. of Germany . |

OTHER PUBLICATIONS

Patent Abstracts of Japan: vol. 12, No. 304 (E-646) Aug. 18, 1988 and JP-A-63 072 124 (Fujitsu Ltd.) Apr. 1, 1988.
DE-Buch: Meinke, H.; Gundlach, F. W.: Taschenbuch der Hochfrequenztechnik, Springer-Verlag Berlin, 1956, S.313-314.
Taner Uckan: Design of a hyperbolic microwave metallic lens. In: Rev. Sci. Instrum. 52, Jan. 1, 1981, S.21-23.

*Primary Examiner*—Mark H. Paschall
*Attorney, Agent, or Firm*—Felfe & Lynch

[57] ABSTRACT

Apparatus for thin-coating processes for the treatment of substrates (8) of large surface area using a plasma (6) which is excited by microwaves (M) and the latter are coupled from a source by means of a waveguide (1) consisting of at least one hollow conductor (1), as well as by means of a horn antenna, into a plasma chamber (5), the waveguide (W) having a substantially rectangular aperture, an area is provided at the end of the hollow conductor (Q) with a slit-like constriction (Q), a rectangular horn (2) adjoins this area, and a compensation area (3) is provided between the largest aperture of the rectangular horn (2), as well as of the plasma chamber (5).

5 Claims, 1 Drawing Sheet

APPARATUS FOR THIN-COATING PROCESSES FOR TREATING SUBSTRATES OF GREAT SURFACE AREA

BACKGROUND OF THE INVENTION

The invention relates to an apparatus for thin-coating processes for treating substrates of large surface area, typically with substrate dimensions between 500–1,000 mm by 500–1,000 mm, using a plasma which is excited by high-frequency electromagnetic waves, especially microwaves, and the electromagnetic waves from a source are coupled by means of a waveguide, consisting of at least one hollow conductor as well as a horn antenna, into a plasma chamber which is separated from the waveguide by a window permeable to electromagnetic waves.

In numerous fields of technology plasma processes are used both in coating and in etching apparatus. Various forms of electrical energy serve to produce a plasma. For example, it is possible to use direct currents or low-frequency alternating currents for the production of plasmas. Particularly advantageous is the production of plasma by high-frequency electromagnetic waves, especially microwaves, because in this case, among other benefits, no electrodes are needed which can be contaminated and ablated, and because the plasma produced by microwaves has a higher density of ions and electrons and therefore can be held at higher pressure than a plasma produced by other methods.

The waves emitted by a microwave source with a frequency of, e.g., 2.45 GHz and a free space wavelength of about 12 cm, are usually carried by means of a waveguide and coupled into a plasma chamber, the waveguide consisting as a rule of a hollow conductor and an antenna structure with coupling elements or a horn antenna.

An apparatus is known, for example (OS DE 37 05 666) which is suitable for producing a plasma and treating substrates therein. In this apparatus a microwave guide with a horn radiator (=horn antenna) is used, and rotatable metal reflectors are used within the horn radiator and the plasma chamber to influence the field distribution. The great number of standing waves thereby produced are also referred to as a multi-mode system. By this superimposition of many individual vibrations a wave field is formed which has an improved homogeneity with respect to the microwave lobe radiated by the horn radiator.

For the treatment of substrates of large area, with substrate dimensions, for example, up to 1,000 by 1,000 mm, however, the requirements as to the homogeneity of the plasma on the entire substrate surface have been further increased. Thus it is to be found disadvantageously that the market requirements as to the homogeneity of the coatings that can be made with the above-described apparatus, insofar as coating thickness and coating composition are concerned, can no longer be satisfied.

SUMMARY OF THE INVENTION

Thus the invention is addressed to the problem of developing an apparatus for the production of a plasma by microwaves which will permit, for large-area substrate dimensions as defined above, a more homogeneous power distribution of the microwaves and hence also of the plasma than apparatus which have long been known.

A large-area substrate can be treated uniformly in one coordinate direction by moving the substrate linearly past a plasma source. From this follows the need to produce a homogeneous input of the microwaves in a second coordinate direction, namely perpendicular to the first coordinate direction.

This problem is solved in accordance with the invention as described in claim 1.

Advantageously, the electromagnetic waves, for example microwaves, upon entering the plasma chamber, have an approximately planar phase front, as well as an approximately uniform amplitude deepening.

Additional possibilities of embodiment and features are further described and specified in the subordinate claims.

BRIEF DESCRIPTION OF THE DRAWING

The invention admits of various possibilities of embodiment; one of them is represented by way of example in the appended figures, wherein.

DESCRIPTION OF THE PREFERRED EMBODIMENT

Figure 1:
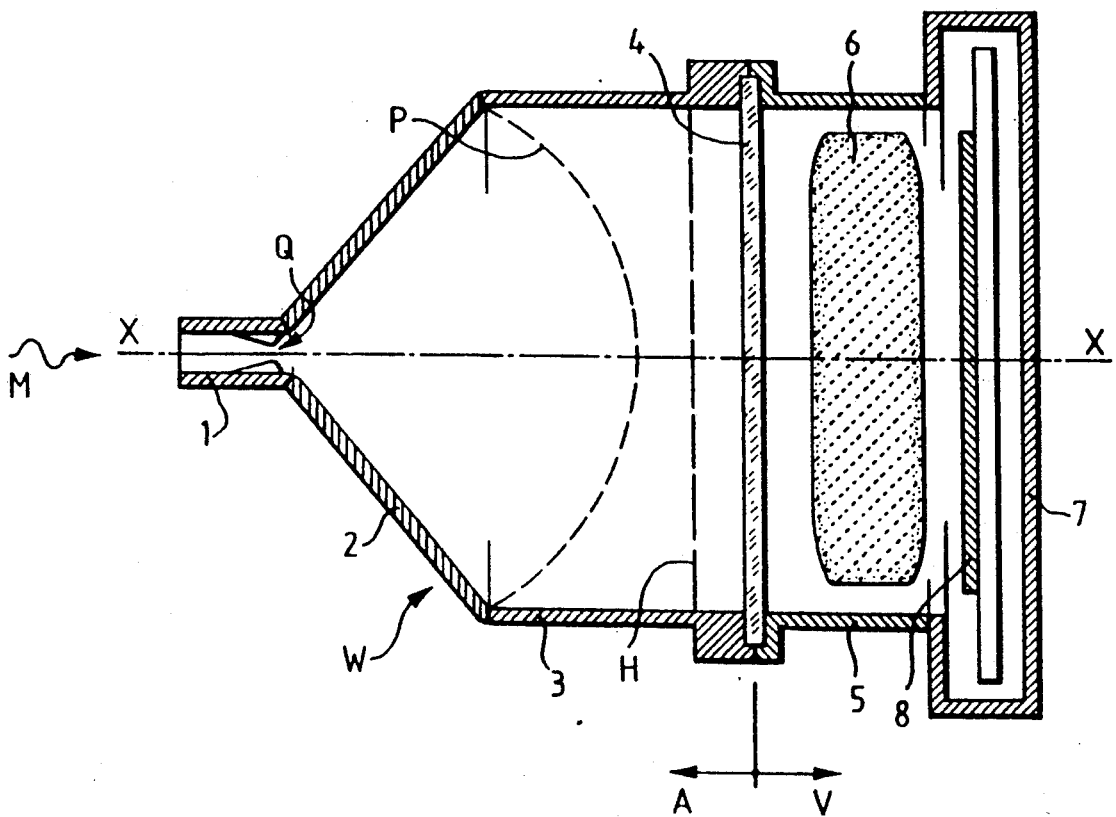
FIG. 1 is a diagrammatic representation of an apparatus according to the invention having a hollow microwave conductor, a rectangular horn and a plasma chamber.

Microwaves M from a microwave source not shown are fed into a rectangular hollow conductor 1 (FIG. 1).

The latter is first provided with a slit-like constriction Q and then merges with a rectangular horn 2 which expands the hollow conductor 1 in a coordinate direction perpendicular to the longitudinal axis X—X as far as the level H. The other two side walls, not shown here, of the horn 2 are parallel. The horn 2 is joined by a parallelepipedal transition 3 which with a planar quartz window 4 divides the area of atmospheric pressure A in the hollow conductor 1 and in the horn 2 from the vacuum area V. Rectangular hollow conductor 1, rectangular horn 2, and the transition 3 together form the waveguide W.

Through the quartz window 4 the microwave radiation M passes into a plasma chamber 5 and delivers power to the plasma 6 therein located. This plasma chamber 5 is adjoined by a substrate chamber 7 through which the substrate 8 can be carried for treatment.

The phase velocity of the microwave M varies in areas with different waveguide apertures. Therefore, at the junction between the rectangular horn 2 and transition 3 a wave is produced having an approximately arcuate phase front P. At the end of the transition 3 the phase front again becomes rectilinear and planar and assumes approximately the shape of the line H, so that the power distribution M is uniform upon entering the plasma chamber 5.

Figure 2:
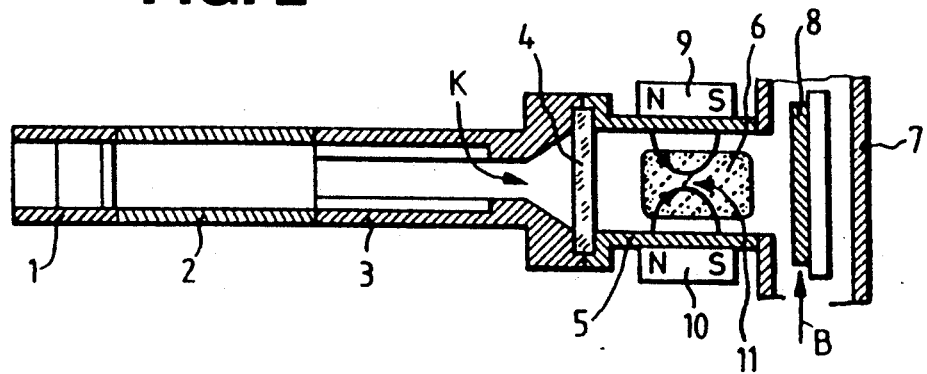
FIG. 2 is a section taken along the longitudinal axis X—X of FIG. 1.

In a section (FIG. 2) through the above-described apparatus it is seen that the side walls of the hollow conductor 1 and horn 2 are parallel. In the transition and compensation area 3 there is, on the one hand, a step-like broadening of the outer edges of the waveguide W to receive the quartz window 4, and on the other hand a funnel-like flaring K of the aperture width is provided.

The plasma chamber 5 has in a middle area a constriction in which two bipolar magnets 9 and 10 are provided, which are disposed on opposite sides and outside of the chamber 5. The area of the plasma 6 is defined in a magnetic field which is formed by the magnetic lines of force 11 of the two magnets 9 and 10. The substrate 8 is moved in front of the plasma 6 and in direction B through the substrate chamber 7. Laterally adjoining the chamber 7 are additional vacuum chamber areas, but they are not represented in detail.

We claim:

1. Apparatus for thin-coating processes for the treatment of substrates of large surface area, with substrate area dimensions between 500–1,000 mm by 500–1,000 mm, using a plasma which is excited by microwaves, and comprising: waveguide means including at least one hollow conductor for coupling microwaves from a source, a rectangular horn, a plasma chamber, a window permeable to electromagnetic waves and separating the waveguide from the plasma chamber, the waveguide having a substantially rectangular aperture comprising an area with a slit-like constriction at an end of the hollow conductor, the rectangular horn directly adjoining this area, and a compensation area being between a greatest aperture of the rectangular horn and of the plasma chamber, the rectangular horn having the greatest aperture area adjacent the compensation area, the rectangular horn having a smallest aperture area adjacent the end of the hollow conductor with the slit-like construction, the compensation area being so dimensioned in its length that the microwaves, upon entering the plasma chamber (5), have an approximately planar phase front which runs substantially parallel to the plane of the window, as well as an approximately uniform amplitude distribution.

2. Apparatus according to claim 1, in which the waveguide (W) as regards its longitudinal axis X—X is made substantially mirror-image symmetrical.

3. Apparatus according to claims 1, in which the waveguide (W) has in an area between the compensation area (3) and the plasma chamber (5) a funnel-shaped flaring (K) of the aperture.

4. Apparatus according to claim 1, in which the rectangular horn (2) has a funnel-like flaring, the funnel-like flaring and the flaring (K) between the compensation area (3) and the plasma chamber (5) are formed each only in a coordinate direction perpendicular to the longitudinal axis X—X of the waveguide.

5. Apparatus according to claim 4, in which a substantially triangular surface of projection of the rectangular horn (2) is disposed perpendicular to a projection surface of the flaring (K).

* * * * *